(12) United States Patent
Lee et al.

(10) Patent No.: US 8,980,742 B2
(45) Date of Patent: Mar. 17, 2015

(54) METHOD OF MANUFACTURING MULTI-LEVEL METAL THIN FILM AND APPARATUS FOR MANUFACTURING THE SAME

(75) Inventors: Jung Wook Lee, Hwaseong-si (KR); Young Hoon Park, Anseong-si (KR)

(73) Assignee: Wonik IPS Co., Ltd., Pyeongtaek, Gyeonggi-Do (KR)

( * ) Notice: Subject to any disclaimer, the term of this patent is extended or adjusted under 35 U.S.C. 154(b) by 219 days.

(21) Appl. No.: 13/060,404

(22) PCT Filed: Sep. 4, 2008

(86) PCT No.: PCT/KR2008/005235
§ 371 (c)(1),
(2), (4) Date: Feb. 23, 2011

(87) PCT Pub. No.: WO2010/027112
PCT Pub. Date: Mar. 11, 2010

(65) Prior Publication Data
US 2011/0151664 A1    Jun. 23, 2011

(51) Int. Cl.
*H01L 21/44*     (2006.01)
*H01L 21/285*    (2006.01)
(Continued)

(52) U.S. Cl.
CPC ............ *H01L 21/28556* (2013.01); *C23C 8/24* (2013.01); *C23C 16/06* (2013.01); *C23C 16/56* (2013.01); *C23C 28/322* (2013.01); *C23C 28/34* (2013.01)
USPC ...................... 438/656; 257/E21.159; 438/68

(58) Field of Classification Search
CPC .... H01L 21/28556; C23C 8/24; C23C 16/06; C23C 16/14; C23C 16/34; C23C 16/56; C23C 28/34; C23C 28/322
USPC .......................................................... 438/656
See application file for complete search history.

(56) References Cited

U.S. PATENT DOCUMENTS

| 6,258,707 B1 | 7/2001 | Uzoh |
| 6,656,831 B1 | 12/2003 | Lee et al. |

(Continued)

FOREIGN PATENT DOCUMENTS

| JP | 07-254574 | 10/1995 |
| JP | 2005-504885 | 2/2005 |

(Continued)

OTHER PUBLICATIONS

International Search Report, Appln No. PCT/KR2008/005235, dated May 29, 2009.

(Continued)

*Primary Examiner* — Leonard Chang
(74) *Attorney, Agent, or Firm* — Kile Park Reed & Houtteman PLLC

(57) ABSTRACT

Provided are methods and apparatuses for manufacturing a multilayer metal thin film without additional heat treatment processes. The method of manufacturing a multilayer metal thin film including steps of: (a) forming a first metal layer on a substrate by flowing a first metal precursor into a first reaction container; and (b) forming a second metal layer on the first metal layer by flowing a second metal precursor into a second reaction container, wherein the step (b) is performed in a range of a heat treatment temperature of the first metal layer so that the second metal layer is formed as the first metal layer is heat-treated.

5 Claims, 4 Drawing Sheets

(51) Int. Cl.
*C23C 8/24* (2006.01)
*C23C 16/06* (2006.01)
*C23C 16/56* (2006.01)
*C23C 28/00* (2006.01)

(56) References Cited

U.S. PATENT DOCUMENTS

| | | | |
|---|---|---|---|
| 6,740,585 B2* | 5/2004 | Yoon et al. | 438/680 |
| 2005/0136659 A1* | 6/2005 | Yun et al. | 438/682 |
| 2006/0078690 A1* | 4/2006 | Lee et al. | 427/569 |

FOREIGN PATENT DOCUMENTS

| | | |
|---|---|---|
| KR | 10-2003-0026878 A | 4/2003 |
| KR | 10-2007-0073947 A | 7/2007 |
| KR | 10-2009-0023955 A | 3/2009 |
| WO | 03/030224 | 4/2003 |

OTHER PUBLICATIONS

Written Opinion of the International Searching Authority, Appln No. PCT/KR2008/005235, dated May 29, 2009.

Japanese Office Action for Japanese Patent Application No. 2011-525967 and English Translation thereof dated Feb. 12, 2013.

* cited by examiner

METHOD OF MANUFACTURING MULTI-LEVEL METAL THIN FILM AND APPARATUS FOR MANUFACTURING THE SAME

BACKGROUND OF THE INVENTION

1. Field of the Invention

The present invention relates to the manufacture of a multilayer metal thin film in a semiconductor manufacturing process, and more particularly, to a method and apparatus for manufacturing a multilayer metal thin film without additional heat treatment processes.

2. Description of the Related Art

As a representative example of a multiplayer metal thin film, there is a cobalt/titanium/titanium nitride (Co/Ti/TiN) layer. The Co/Ti/TiN layer has been widely used to decrease contact resistance between a source/drain region and a gate as a metal oxide semiconductor (MOS) device is miniaturized on a scale of tens of nanometers or less. Here, in general, a Co layer, a Ti layer, and a TiN layer are formed at different reaction containers from each other, and after the Co layer is deposited, in order to decrease contact resistance, carbon included in the Co layer is removed by performing heat treatment or plasma processing.

FIG. 1 is a view illustrating a conventional example of a method of manufacturing a Co/Ti/TiN layer. FIG. 2 is a view illustrating an example of an apparatus 200 for manufacturing the Co/Ti/TiN layer illustrated in FIG. 1.

Referring to FIGS. 1 and 2, conventionally, Co is deposited on a silicon substrate in a first reaction container 210 in a chemical vapor deposition (CVD) process to form a Co layer (step S110), and heat treatment or plasma processing is performed in a second reaction container 220 to decrease resistance of the Co layer (step S120). Thereafter, Ti is deposited in a third reaction container 230 to form a Ti layer (step S130), and a TiN layer is formed in a fourth reaction container 240 (step S140).

However, in the aforementioned method, after the Co layer is formed in the first reaction container 210 in the CVD process, the second reaction container 220 is needed to perform the heat treatment or plasma processing. In addition, when a wafer is transferred to the third reaction container 230 after the heat treatment or plasma processing is performed, the wafer is exposed to the air and a natural oxide layer is formed thereon, and this causes increase in the contact resistance. In addition, in order to form the Co/Ti/TiN layer, the four reaction containers are needed. Accordingly, there is a problem in that productivity of the Co/Ti/TiN layer may be decreased.

In order to solve the aforementioned problem, recently, the heat treatment or plasma processing performed in the second reaction container 220 and forming the Ti layer performed in the third reaction container 230 are performed in a single reaction container. Specifically, in the single reaction container, the Co layer is heat-treated, and the Ti layer is then formed. However, in this method, the heat treatment of the Co layer and the formation of the Ti layer are separately performed, so that there is a problem in that forming the Co/Ti/TiN layer still requires much time.

SUMMARY OF THE INVENTION

The present invention provides a method and apparatus for manufacturing a multilayer metal thin film without additional heat treatment processes of a lower metal layer by setting a deposition temperature of an upper metal layer to a range of a heat treatment temperature of the lower metal layer.

According to an aspect of the present invention, there is provided a method of manufacturing a multilayer metal thin film including steps of: (a) forming a first metal layer on a substrate by flowing a first metal precursor into a first reaction container; and (b) forming a second metal layer on the first metal layer by flowing a second metal precursor into a second reaction container, wherein the step (b) is performed in a range of a heat treatment temperature of the first metal layer so that the second metal layer is formed as the first metal layer is heat-treated.

According to another aspect of the present invention, there is provided a method of manufacturing a multilayer metal thin film including steps of: (a) depositing a first metal layer on a substrate by flowing a first metal precursor into a first reaction container; and (b) sequentially forming a second metal nitride layer having an N ratio of from 5% to 35% on the first metal layer and a second metal nitride layer having a second metal ratio of from 5% to 35% thereon by flowing a second metal precursor and an N precursor into a second reaction container, wherein the step (b) is performed in a range of a heat treatment temperature of the first metal layer so that the second metal nitride layers are formed as the first metal layer is heat-treated.

According to another aspect of the present invention, there is provided an apparatus for manufacturing a multilayer metal thin film includes a plurality of reaction containers. A cobalt (Co) layer is formed on a substrate in each of two reaction containers, and a titanium (Ti) layer is formed on the Co layer in a range of a heat treatment temperature of the Co layer in other two reaction containers.

According to another aspect of the present invention, there is provided an apparatus for manufacturing a multilayer metal thin film includes a plurality of reaction containers. A Co layer is formed on a substrate in each of two reaction containers, a titanium nitride (TiN) layer having an N ratio of from 5% to 35% and a TiN layer having a Ti ratio of from 5% to 35% are sequentially formed on the Co layer in the other two reaction containers from among the plurality of the reaction containers in a range of a heat treatment temperature of the Co layer.

According to another aspect of the present invention, there is provided an apparatus for manufacturing a multilayer metal thin film includes a plurality of reaction containers. A Co layer is formed on a substrate in each of two reaction containers, a Ti layer is formed on the Co layer in the other reaction container in a range of a heat treatment temperature of the Co layer, and a TiN layer is formed on the Ti layer in the other reaction container from among the plurality of the reaction containers.

DESCRIPTION OF THE PREFERRED EMBODIMENTS

Exemplary embodiments of the present invention will now be described in detail with reference to the accompanying drawings.

Figure 3:
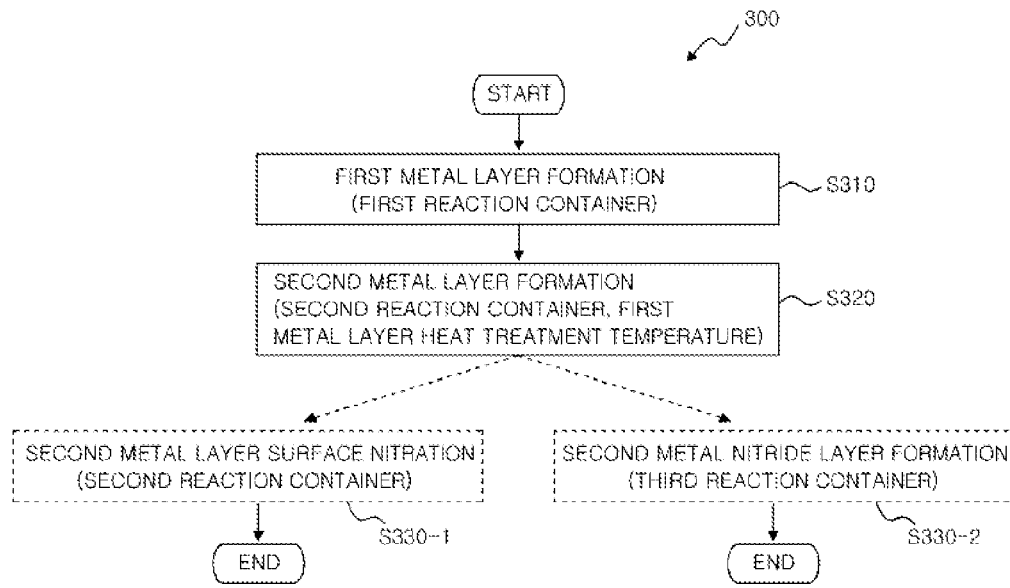
FIG. 3 illustrates a method of manufacturing a multiplayer metal thin film according to an embodiment of the present invention.

FIG. 3 illustrates a method of manufacturing a multiplayer metal thin film according to an embodiment of the present invention.

The method 300 of manufacturing the multilayer metal thin film illustrated in FIG. 3 includes a step S310 of forming a first metal layer and a step S320 of forming a second metal layer.

In the step S310 of forming the first metal layer, the first metal layer is formed on a substrate by flowing a first metal precursor into a first reaction container. In the step S320 of forming the second metal layer, the second metal layer is formed on the first metal layer by flowing a second metal precursor into a second reaction container.

Here, the step S320 of forming the second metal layer is performed in a range of a heat treatment temperature of the first metal layer so that the second metal layer is formed as the first metal layer is heat-treated. In order to decrease resistance of the first metal layer, conventionally, additional heat treatment or plasma processing is performed. However, according to the present invention, the second metal layer is formed in the range of the heat treatment temperature of the first metal layer, and the formation of the second metal layer and the heat treatment of the first metal layer can be simultaneously performed. Therefore, an additional time to perform heat treatment on the first metal layer can be reduced, so that the entire time to manufacture the multilayer metal thin film can be reduced.

After forming the second metal layer, in order to perform surface treatment on the second metal layer, a surface of the second metal layer may be nitrated (step S330-1), or a second metal nitride layer may further be formed on the second metal layer (step S330-2).

In a method of nitrating the surface of the second metal layer (step S330-1), gasses including nitrogen compounds such as ammonia ($NH_3$) and nitrogen ($N_2$) along with argon (Ar), hydrogen ($H_2$), or the like may be flown into the second reaction container in which the second metal layer is formed. For example, Ar of 1 SLM (standard liters per minute) or more, $NH_3$ of 1 SLM or more, $H_2$ of 4 SLM or more, $N_2$ of 1 SLM or less are flown into the second reaction container, power of 1000 W or more is applied to the reaction container, and pressure of 1 torr or more is maintained in the reaction container to nitrate the surface of the Ti layer.

The method of further forming the second metal nitride layer on the second metal layer may be implemented by flowing the second precursor and a nitrogen precursor into the second reaction container or an additional third reaction container and depositing a second metal nitride. Since the aforementioned step is performed in a thermal deposition process, the aforementioned step may be performed in the third reaction instead of the second reaction container.

If the multilayer metal thin film that is to be manufactured is a cobalt/titanium/titanium nitride (Co/Ti/TiN) layer, the Co/Ti/TiN layer may be manufactured in the following steps according to the manufacturing method 300 illustrated in FIG. 3.

First, in the step S310 of forming the first metal layer, the Co layer is formed on the substrate by flowing a Co precursor into the first reaction container at a low temperature of about from 100° C. to 200° C.. In the step S320 of forming the second metal layer, a Ti layer is formed on the Co layer by flowing a Ti precursor into the second reaction container. Here, since the heat treatment temperature of the Co layer is about 500° C., if a temperature for forming the Ti layer in the second reaction container is set to about 450° C. to 550° C., the heat treatment of the Co layer and forming the Ti layer on the Co layer can be simultaneously performed.

Thereafter, the surface of the Ti layer is nitrated and the TiN layer is further formed to manufacture the Co/Ti/TiN layer. Therefore, without an additional heat treatment process of a Co layer, the desired Co/Ti/TiN layer can be obtained, and times and costs consumed to perform the additional heat treatment process of the Co layer are not needed.

Figure 4:
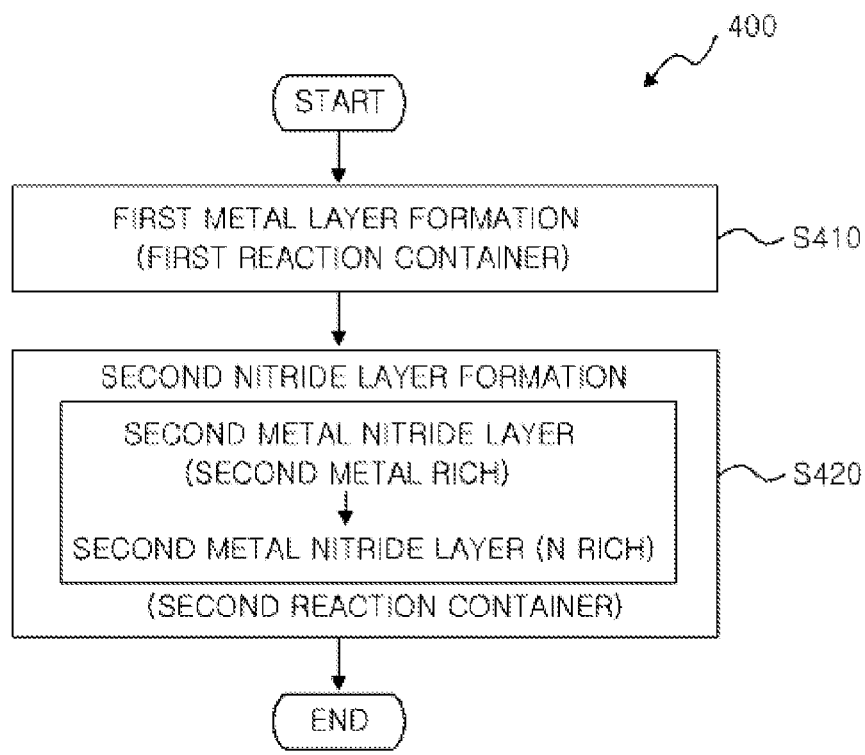
FIG. 4 illustrates a method of manufacturing a multilayer metal thin film according to another embodiment of the present invention.

FIG. 4 illustrates a method of manufacturing a multilayer metal thin film according to another embodiment of the present invention.

The method 400 of manufacturing the multilayer metal thin film illustrated in FIG. 4 includes a step S410 of forming a first metal layer and a step S420 of forming a second metal nitride layer.

In the step S410 of forming the first metal layer, the first metal layer is deposited on a substrate by flowing a first metal precursor into a first reaction container. In the step S420 of forming the second metal nitride layer, by flowing a second metal precursor and a nitrogen precursor into a second reaction container, the second metal nitride layer having a nitrogen ratio of from 5% to 35% (referred to as second metal rich) and a second metal nitride layer having a second metal ratio of from 5% to 35% (referred to as N rich) are sequentially formed on the first metal layer. Here, the step S420 of forming the second metal nitride layer is formed in the range of the heat treatment temperature of the first metal layer so that the second metal nitride layers are formed as the first metal layer is heat-treated.

The second metal nitride layer that is the second metal rich firstly deposited in the step S420 of forming the second metal nitride layers is formed to have a relatively low nitrogen ratio so as to have a composition similar to the second metal layer. Therefore, as compared with a method of forming and additionally nitrating the second metal layer in the second reaction container or a method of forming the second metal nitride layer, in this method, by controlling a flux of the precursors flown into the second reaction container, a processing time can further be reduced.

If the multilayer metal thin film to be manufactured is the Co/Ti/TiN layer, the Co/Ti/TiN layer is manufactured in the following steps according to the manufacturing method 400 illustrated in FIG. 4.

In the step S410 of forming the first metal layer, a Co layer is deposited on the substrate by flowing a Co precursor into the first reaction container at a temperature of from 100° C. to 200° C. In the step S420 of forming the second metal nitride layer, a Ti precursor and a nitrogen precursor are flown into the second reaction container at a temperature of about from 450° C. to 550° C. corresponding to the range of the heat treatment temperature of the Co layer to sequentially form a TiN layer that is a Ti rich that is close to a composition of the Ti layer and a TiN layer that is an N rich on the Co layer.

In the method 300 of manufacturing the multilayer metal thin film illustrated in FIG. 3, while the second metal layer is formed in the second reaction container (step S320), plasma may be applied to the second reaction container to further perform plasma processing on the first metal layer in addition to the formation of the second metal layer and the heat treatment of the first metal layer. Similarly, in the method 400 of manufacturing the multilayer metal thin film illustrated in FIG. 4, while the second metal nitride layers are sequentially formed in the second reaction container (step S420), the plasma may be applied. Here, the plasma may be based on a gas including hydrogen (H) such as $H_2$ and $NH_3$. When the plasma is applied, in addition to the formation of the second metal layer or the second metal nitride layer and the heat treatment of the first metal layer, the plasma processing is further performed on the first metal layer, so that resistance of the first metal can be reduced.

Figure 5:
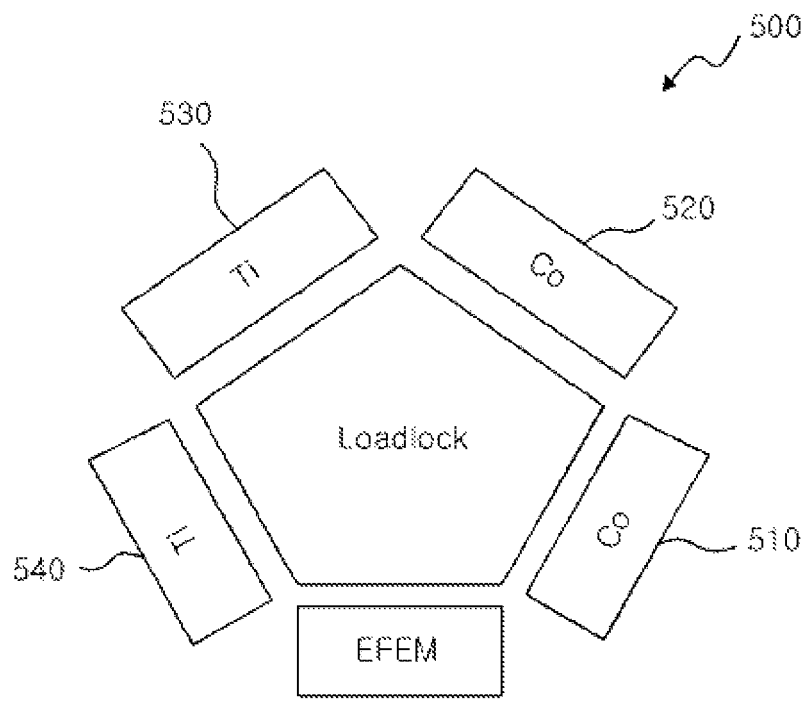
FIGS. 5 to 7 illustrate apparatuses for manufacturing a multilayer metal thin film according to embodiments of the present invention.

FIG. 5 illustrates an apparatus for manufacturing a multilayer metal thin film according to an embodiment of the present invention, and more particularly, an apparatus for manufacturing the Co/Ti/TiN layer using the method 300 or 400 of manufacturing the multilayer metal thin film described with reference to FIG. 3.

Referring to the apparatus 500 of manufacturing the Co/Ti/TiN layer illustrated in FIG. 5, among a plurality of reaction containers 510 to 540, the two reaction containers 510 and 520 may be used for forming the Co layer (step S310 of FIG. 3) and the other two reaction containers 530 and 540 may be used for forming the Ti layer (step S320 of FIG. 3). In addition, the two reaction containers 530 and 540 may be used for nitrating the surface of the Ti layer (step S330-1 of FIG. 3) after forming the Ti layer.

By using the apparatus 500 of manufacturing the Co/Ti/TiN layer illustrated in FIG. 3, two wafers are transferred from an equipment front end module (EFEM) to the two reaction containers 510 and 520 for forming the Co layer through a wafer transfer robot provided to a loadlock chamber. The two wafers on which the Co layer is formed are transferred to the two reaction containers 530 and 540 for performing the heat treatment on the Co layer and simultaneously forming the Ti layer through the wafer transfer robot, and other two wafers are transferred from the EFEM to the two reaction containers 510 and 520 for forming a Co layer.

Figure 1:
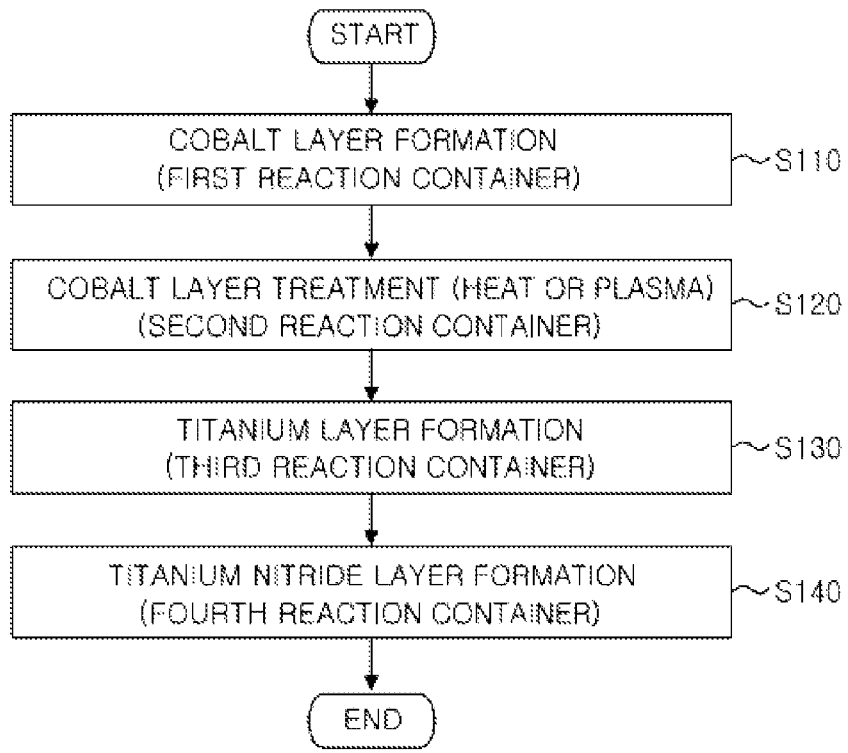
FIG. 1 is a view illustrating a conventional example of a method of manufacturing a cobalt/titanium/titanium nitride (Co/Ti/TiN) layer.
Figure 2:
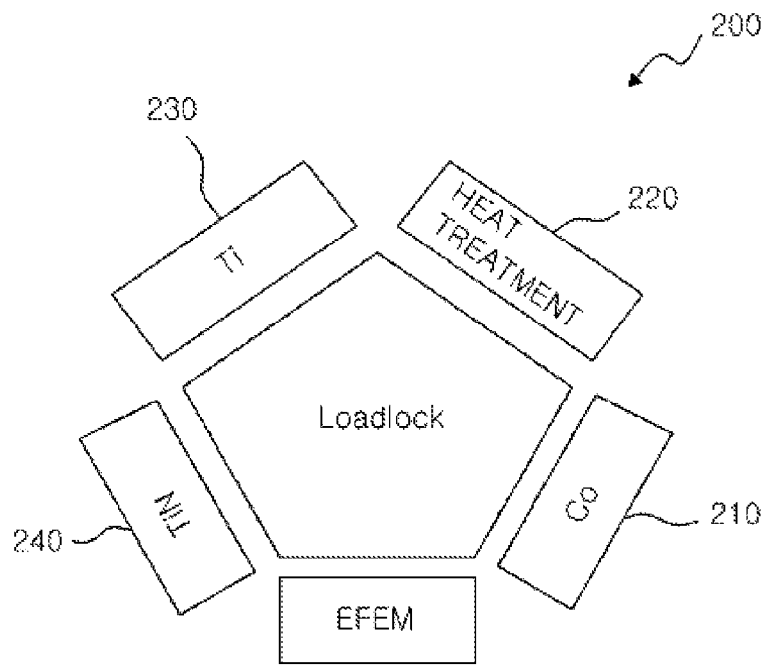
FIG. 2 is a view illustrating an example of an apparatus for manufacturing the Co/Ti/TiN layer illustrated in FIG. 1.

When the apparatus 200 for manufacturing the multilayer metal thin film illustrated in FIG. 2 is used, wafers have to be transferred through the four reaction containers sequentially to manufacture the Co/Ti/TiN layer. However, when the apparatus 500 for manufacturing the multilayer metal thin film illustrated in FIG. 5 is used, the wafers are transferred through only the two reaction containers to manufacture the Co/Ti/TiN layer. Therefore, manufacturing efficiency of the Co/Ti/TiN layer can be significantly increased.

In addition, after the Co layer is formed in the two reaction containers 510 and 520, the wafers can be directly transferred to the two containers 530 and 540 for forming the Ti layer in a vacuum condition, so that the Co layer is not exposed to the air. Therefore, the increase in specific resistance of the Co layer due to formation of a natural oxide layer can be prevented, and the Co/Ti/TiN layer with a good quality can be manufactured.

Figure 6:
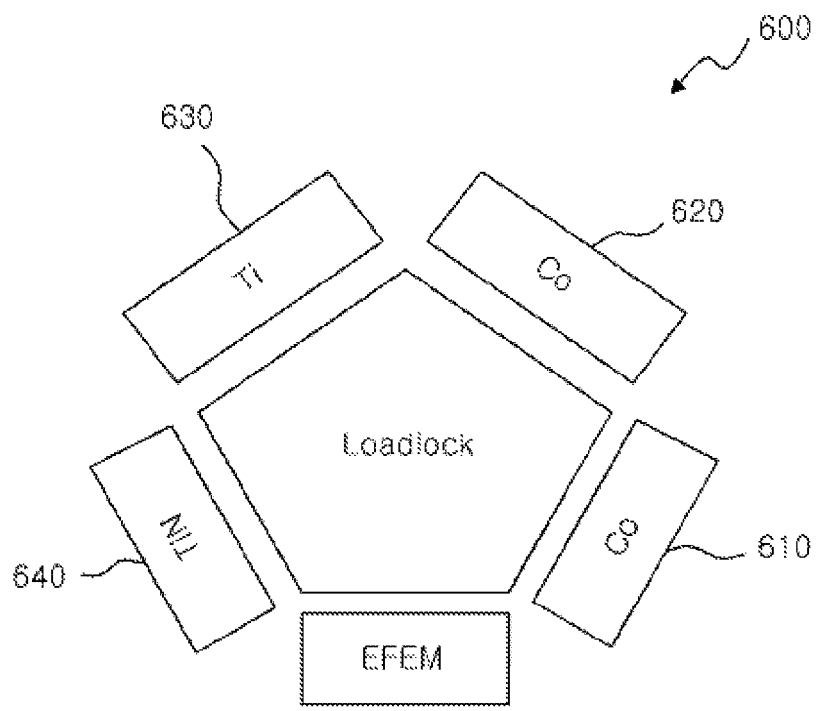
Figure 7:
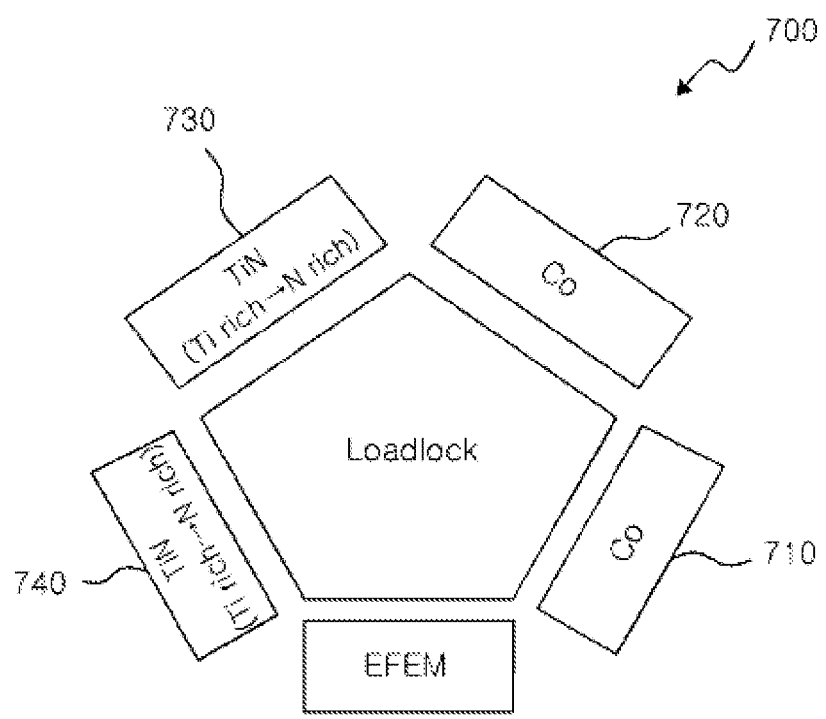

FIGS. 6 and 7 illustrate apparatuses of manufacturing the multilayer metal thin film according to embodiments of the present invention, and more specifically, apparatuses for manufacturing the Co/Ti/TiN layer by using the methods 300 and 400 of manufacturing the multilayer metal thin film described with reference to FIGS. 3 and 4, respectively.

Referring to the apparatus 600 for manufacturing the Co/Ti/TiN layer illustrated in FIG. 6, among a plurality of reaction containers 610 to 640, two reaction containers 610 and 620 may be used for forming the Co layer (step S310 of FIG. 3,), the other reaction container 630 may be used for forming the Ti layer (step S320 of FIG. 3), and the other reaction container 640 may be used for forming the TiN layer (step S330-2 of FIG. 3). In addition, referring to the apparatus 700 for manufacturing the Co/Ti/TiN layer illustrated in FIG. 7, among a plurality of reaction containers 710 to 740, two reaction containers 710 and 720 ma be used for forming the Co layer (step S410 of FIG. 4), and the other two reaction containers 730 and 740 may be used for forming the TiN layer (step S420 of FIG. 4).

In the apparatuses 500 and 600 of manufacturing the Co/Ti/TiN layer illustrated in FIGS. 5 and 6, respectively, while the Ti layer is formed in the reaction containers 530, 540, and 630 for forming the Ti layer, the plasma is applied to increase efficiency of decreasing contact resistance of the Co layer, so that the plasma processing can further be performed on the Co layers in addition to the heat treatment of the Co layers and the formation of the Ti layer. Similarly, in the apparatus 700 for manufacturing the Co/Ti/TiN layer illustrated in FIG. 7, while the TiN layers are sequentially formed in the reaction containers 730 and 740 for forming the TiN layers, the plasma may be applied. Here, the plasma may be based on the gas including hydrogen such as $H_2$ and $NH_3$.

The method and apparatus for manufacturing the multilayer metal thin film according to the present invention does not need additional heat treatment processes for a lower metal layer by setting a deposition temperature of an upper metal layer to a range of a heat treatment temperature of the lower metal layer, so that efficiency of the manufacture of the multilayer metal thin film can be increased.

In addition, the method and apparatus for manufacturing the multilayer metal thin film according to the present invention can reduce the number of reaction containers needed to perform deposition processes for the multilayer metal thin film, so that productivity of the manufacture of the multilayer metal thin film can be increased.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a multilayer metal thin film, comprising steps of:
    (a) forming a cobalt (Co) layer on a substrate by flowing a cobalt (Co) precursor into a first reaction container; and,
    (b) forming a titanium (Ti) layer on the cobalt (Co) layer by flowing a titanium (Ti) precursor into a second reaction container without prior heat treatment of the cobalt (Co) layer,
    wherein forming the titanium (Ti) layer and a heat treatment of the cobalt (Co) layer to remove carbon included in the cobalt (Co) layer are simultaneously performed at a temperature between 450° C. and 550° C.

2. The method of claim 1, further comprising a step (c) of nitrating a surface of the titanium (Ti) layer in the second reaction container.

3. The method of claim 2, wherein in the step (b), plasma processing is further performed on the cobalt (Co) layer by applying plasma to the second reaction container.

4. The method of claim 3, wherein the plasma is based on a gas including hydrogen.

5. The method of claim 4, wherein the gas including hydrogen is hydrogen ($H_2$) or ammonia ($NH_3$).

* * * * *